United States Patent

Nakamura et al.

[11] Patent Number: 5,159,708
[45] Date of Patent: Oct. 27, 1992

[54] MULTIPATH DETECTOR FOR AN FM TUNER

[75] Inventors: Tetsuo Nakamura; Masahide Terada, both of Saitama, Japan

[73] Assignee: Pioneer Electronic Corporation, Tokyo, Japan

[21] Appl. No.: 680,968

[22] Filed: Apr. 5, 1991

[30] Foreign Application Priority Data

Sep. 26, 1990 [JP] Japan ................... 2-256526

[51] Int. Cl.$^5$ ............................................. H04B 1/16
[52] U.S. Cl. ............................................. 455/214
[58] Field of Search .............. 455/295, 296, 214, 302, 455/307, 336, 226, 52

[56] References Cited

U.S. PATENT DOCUMENTS

| | | | |
|---|---|---|---|
| 4,511,849 | 4/1985 | Yoshihisa | 455/214 |
| 4,547,739 | 10/1985 | Lutz | 455/214 |
| 4,567,441 | 1/1986 | Main | 455/214 |
| 4,578,807 | 3/1986 | Okanoby | 455/214 |
| 4,926,132 | 5/1990 | Main | 455/214 |
| 4,998,289 | 3/1991 | Rabe et al. | 455/296 |

Primary Examiner—Curtis Kuntz
Attorney, Agent, or Firm—Nikaido, Marmelstein, Murray & Oram

[57] ABSTRACT

A multipath detector circuit is in a form of a differential amplifier and has a first level dependent on strength of a received signal and a second level set to a lower level than the first level. The circuit produces a multipath level signal when the first level reduces below a threshold represented by a difference between the first level and the second level increases with an increase of the first level. The multipath detector circuit is arranged so that the threshold increases with an increase of the first level.

3 Claims, 3 Drawing Sheets

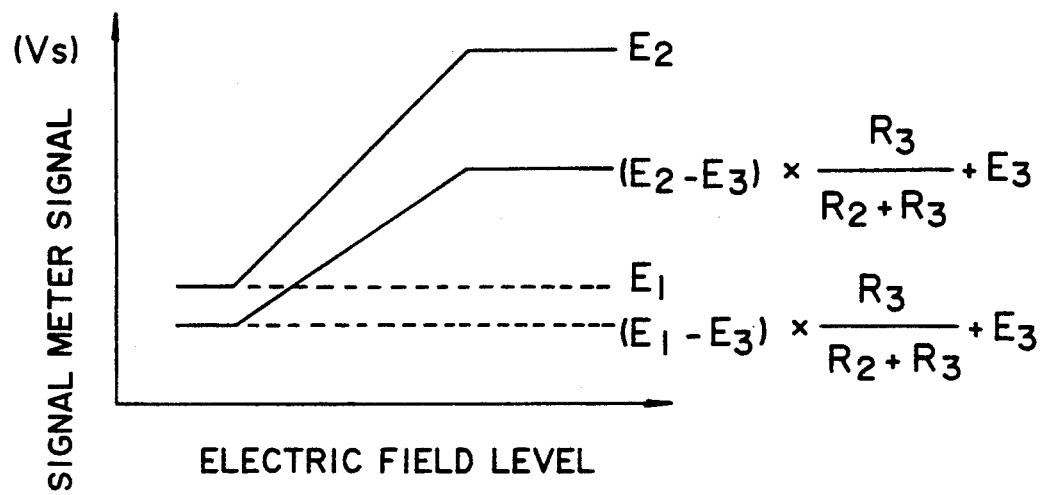
FIG.2
FIG.4
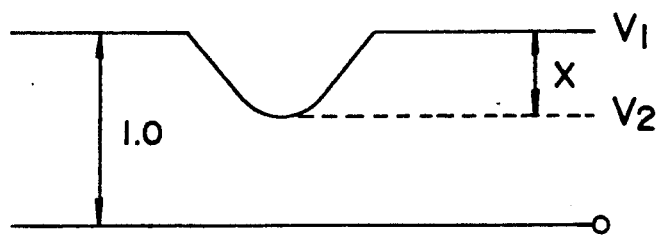

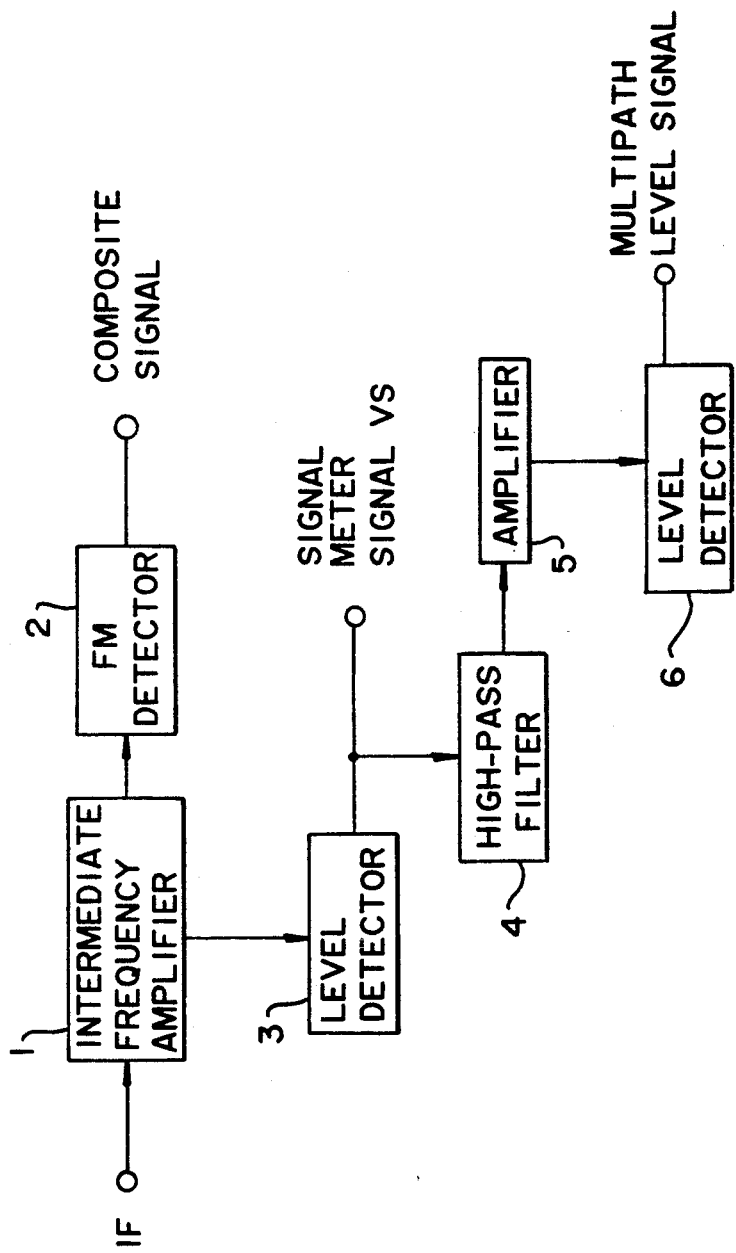

MULTIPATH DETECTOR FOR AN FM TUNER

BACKGROUND OF THE INVENTION

The present invention relates to a multipath detector for an FM tuner.

The multipath is the propagation phenomenon that results in signals reaching an antenna by two or more paths including at least one reflection from some object, causing distortion in radio signals.

When the multipath which is also called multipath transmission generates, the amplitude of the FM signal produced from an intermediate frequency amplifier is modified to generate an alternating current component in the FM signal. The multipath detector detects the alternating current component.

FIG. 3 shows a conventional multipath detector in the FM tuner. An intermediate frequency (IF) obtained through a front end (not shown) is amplified through an intermediate frequency amplifier 1 and applied to an FM detector 2 where a composite signal is obtained.

The composite signal is demodulated by a stereo demodulator (not shown) to extract a main signal (L+R) and a sub signal (L−R) to provide right and left signals.

Another signal from the amplifier 1 is applied to a level detector 3 which detects a level of the signal. An output signal Vs from the level detector 3 is applied to a signal meter to detect the strength of the received signal. The signal meter signal Vs is also applied to a high-pass filter 4 where the alternating current component included in the signal meter signal Vs is extracted as a multipath signal. The multipath signal is applied to a level detector 6 through an amplifier 5. The level detector 6 detects a level of a multipath to produce a multipath level signal which is displayed, for example by a multipath meter. The level detector 6 has a detecting level V2 in order to detect the multipath. The detecting level V2 is lowered from a level of electric field V1 by a value X as shown in FIG. 4.

Hereinafter a preferable relationship between V1 and V2 will be described. The signal meter signal Vs includes also another alternating current component generated by the frequency modulation and selecting elements such as ceramic filter and coil. Such an inherent component must not be filtered. Therefore, the detecting level V2 must be larger than the inherent component.

Here, if the threshold is V(x), $$V(x) = V1 - V2 \quad (1)$$

Since the signal meter has a logarithmic characteristic, $$V1 = A \cdot \log_{10}(VIN + VO) \quad (2)$$

where A is a constant, VIN is the input level of electric field, and VO is the residual noise level.

Similarly, $$V2 = A \cdot \log_{10}(VIN(1-x) + VO) \quad (3)$$

Here, the value x represents a degree of amplitude modulation of the level V1.

Therefore $$0 \leq x \leq 1 \quad (4)$$

From the equations (1), (2) and (3), $$V(x) = A \cdot \log_{10}(VIN + VO) - A \cdot \log_{10}(VIN(1-x) + VO)$$

$$dV(x)/dVIN = A'1 \cdot xVO/((VIN + VO) \cdot (VIN(1-x) + VO))$$

Since $A'1 = A/\log_{10}e$, VIN 0, $(1-x) \geq 0$, and $x \geq 0$, if the value x is $x \neq 0$, $$dV(x)/dVIN > 0$$

Namely, if the level VIN is large, the level V(x) corresponding to the amplitude modulation degree is large. Consequently, it will be understood that it is necessary to increase the threshold with an increase of the electric field level. Otherwise, it is impossible to properly detect the multipath.

SUMMARY OF THE INVENTION

The object of the present invention is to provide a multipath detector in an FM tuner which may properly detect the level of a multipath by increasing the threshold with the electric field level.

According to the present invention, there is provided a multipath detector for an FM tuner comprising a detector device for detecting strength of a received signal and for producing first level dependent on the strength, and a multipath detector circuit having a second level lower than the first level and producing a multipath level signal when the first level reduces below the second level. The multipath detector circuit is so arranged that the second level changes with the first level and the difference between the first level and the second level increases with an increase of the first level.

In an aspect of the invention, the multipath detector circuit includes a differential amplifier, and a current mirror circuit is provided for detecting the multipath level signal.

The other objects and features of this invention will become understood from the following description with reference to the accompanying drawings.

BRIEF DESCRIPTION OF DRAWINGS

FIG. 2 is a graph showing a characteristic of a threshold responsive to a level of electric field;

FIG. 3 is a block diagram showing a conventional multipath detector; and

FIG. 4 is a graph showing a relationship between the electric field level and the threshold.

DETAILED DESCRIPTION OF THE PREFERRED EMBODIMENT

Figure 1:
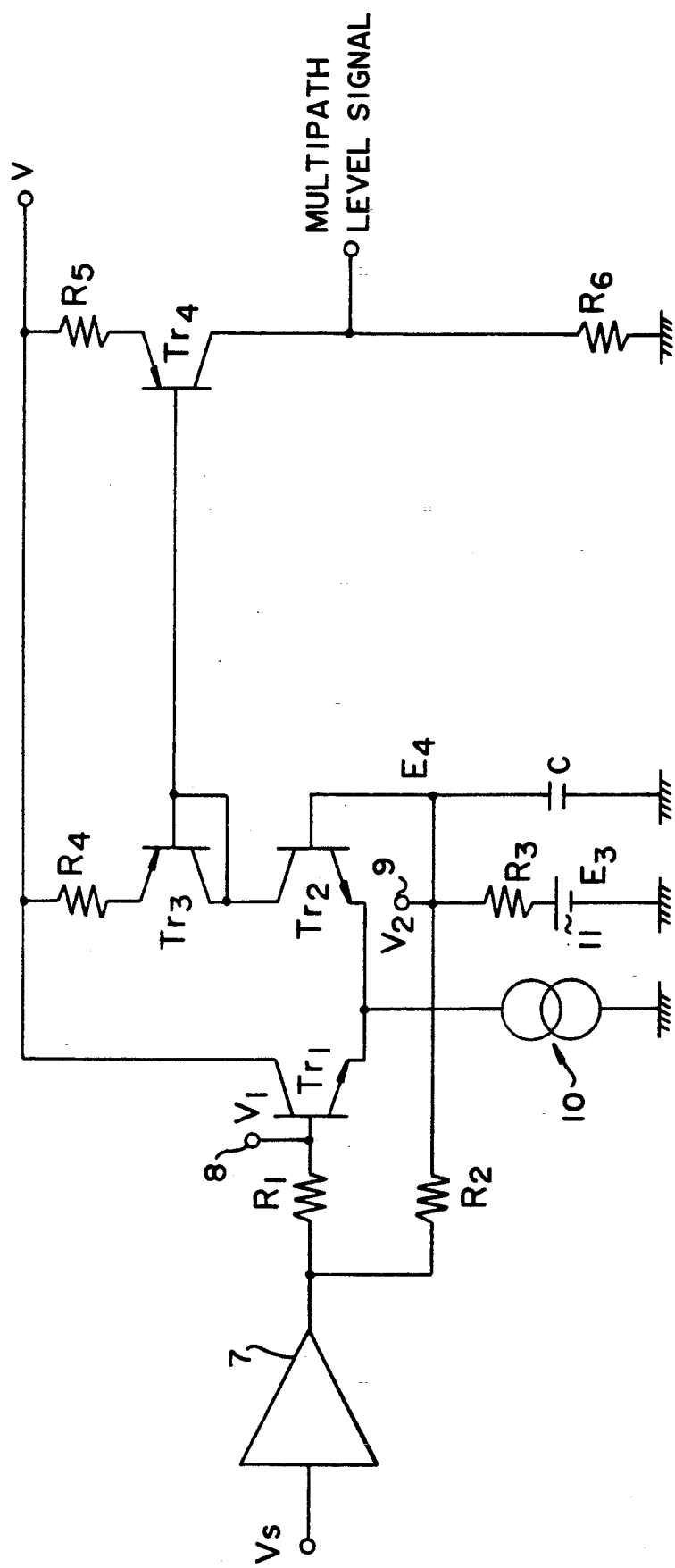
FIG. 1 shows a circuit of a multipath detector according to the present invention.

Referring to FIG. 1, a multipath detector of the present invention comprises a buffer amplifier 7 to which the signal meter signal Vs from the level detector 3 of FIG. 3 is applied. The buffer amplifier 7 is connected to a base of a transistor Tr1 through a resistor R1. An emitter of the transistor Tr1 is connected to an emitter of a transistor Tr2. A constant current source 10 is connected between emitters of the transistors Tr1 and Tr2.

The output of the buffer amplifier 7 is further connected to the base of the transistor Tr2 through a resistor R2 to form a differential amplifier. Further, a source 11 is connected to the base of the transistor Tr2 through a resistor R3 and a capacitor C is connected to the base of the transistor Tr2. The electric field level V1 is the voltage at a point 8, and the detecting level V2 is the voltage at a point 9.

A source V is connected to the collector of the transistor Tr1, the collector of the transistor Tr2 through a transistor Tr3 and a resistor R4, and an emitter of a transistor Tr4 through a resistor R5, respectively. The base of the transistor Tr3 is connected to the base of the transistor Tr4. The collector of the transistor Tr4 is connected to ground though a resistor R6.

The Transistors Tr3 and Tr4 compose a current mirror circuit.

The operation of the multipath detector will be described hereinafter with reference to the graph of FIG. 2. Since V1>V2, the transistor Tr1 is turned on and the transistor Tr2 is turned off. When the multipath generates and the signal Vs is reduced lower than the level V2, the level V1 reduces in accordance with the reduced value Vs. Consequently, the levels momentarily becomes V1<V2. Thus, the transistor Tr2 is turned on and hence the transistor Tr3. In accordance with the operation of the current mirror circuit of the transistors Tr3 and Tr4, the level of the multipath is detected as a load voltage of the resistor R6.

When Vs=E1, the threshold (V1-V2) is represented as follows.

$$V1 - V2 = E1 - (E1 - E3) \cdot (R3/(R2 + R3)) - E3$$
$$= (E1 - E3) \cdot (R2/(R2 + R3))$$

where E3 is the voltage of the source 11. When Vs=E2, the threshold is $$V1-V2=(E2-E3)\cdot(R2/(R2+R3))$$

Since (E2−E3)>(E1−E3), the threshold at V1=E2 is larger than that at V1=E1. Namely, the threshold increases with the electric field.

In accordance with the present invention, the threshold for detecting the multipath is increased with an increase of the level of the electric field. Thus, the level of multipath is properly detected corresponding to the electric field level. Consequently, the erroneous detection of the inherent components in the FM tuner is prevented.

While the presently preferred embodiments of the present invention has been shown and described, it is to be understood that this disclosure is for the purpose of illustration and that various changes and modification may be made without departing from the scope of the invention as set forth in the appended claims.

What is claimed is:

1. A multipath detector for an FM tuner comprising:
   detector means for detecting strength of a received signal and for producing first level dependent on the strength;
   a multipath detector circuit having a second level set to a lower level than said first level and producing a multipath level signal when said first level is reduced below a threshold represented by a difference between said first and second levels,
   said multipath detector circuit being so arranged that said threshold increases with an increase of said first level.

2. The multipath detector according to claim 1 wherein the multipath detector circuit includes a differential amplifier.

3. The multipath detector according to claim 2 further comprising a current mirror circuit for detecting the multipath level signal.

* * * * *